United States Patent [19]
Hull

[11] Patent Number: 5,600,522
[45] Date of Patent: Feb. 4, 1997

[54] HIGH TEMPERATURE SUPERCONDUCTING FAULT CURRENT LIMITER

[75] Inventor: John R. Hull, Hinsdale, Ill.

[73] Assignee: ARCH Development Corporation, Chicago, Ill.

[21] Appl. No.: 292,410

[22] Filed: Aug. 18, 1994

Related U.S. Application Data

[63] Continuation of Ser. No. 923,712, Jul. 31, 1992, abandoned.
[51] Int. Cl.⁶ ........................................................ H02H 9/00
[52] U.S. Cl. ............................................. 361/19; 505/850
[58] Field of Search ...................... 361/19, 141; 505/883, 505/887, 850, 881; 323/360

[56] References Cited

U.S. PATENT DOCUMENTS

| | | | |
|---|---|---|---|
| 4,929,596 | 5/1990 | Meyer et al. | 505/1 |
| 4,994,932 | 2/1991 | Okamoto et al. | 361/19 |
| 5,153,804 | 10/1992 | Pham et al. | 361/19 |

*Primary Examiner*—Jeffrey A. Gaffin
*Assistant Examiner*—Sally C. Medley
*Attorney, Agent, or Firm*—Reinhart, Boerner, Van Deuren, Norris & Rieselbach, s.c.

[57] ABSTRACT

A fault current limiter (10) for an electrical circuit (14). The fault current limiter (10) includes a high temperature superconductor (12) in the electrical circuit (14). The high temperature superconductor (12) is cooled below its critical temperature to maintain the superconducting electrical properties during operation as the fault current limiter (10).

21 Claims, 8 Drawing Sheets

HIGH TEMPERATURE SUPERCONDUCTING FAULT CURRENT LIMITER

This invention was made with Government support under Contract No. W-31-109-ENG-38 awarded by the Department of Energy. The Government has certain rights in this invention.

This is a continuation of Ser. No. 07/923,712 filed Jul. 31, 1992, now abandoned.

The present invention is directed to a high temperature superconductor ("HTSC") current limiter. More particularly, the invention is directed to an HTSC fault current limiter operable in a resistive switching mode free of inductance. In addition, the HTSC fault current limiter provides an enhanced switching speed while being highly stable under thermally unstable operating conditions. A particularly useful form of HTSC fault current limiter is fabricated in a small coil geometry to provide enhanced switching performance.

Fault currents are temporary, large increases in the normal current in a power transmission line or system. These fault currents can arise from unusual natural events, such as lighting strikes, or from catastrophic failure of electrical equipment. The fault currents give rise to introduction of large, unwanted currents in electrical systems which can cause severe damage and large financial loss. Due to the increasing interconnection of power systems, the effect of electrical power equipment failures can be devastating.

Currently, there is a large and increasing demand for reliable fault current limiters, such as in tandem in high voltage transmission systems. For example, in 1980 circuit breaker replacement costs were about thirteen million dollars in the U.S. alone.

Using conventional circuit breaker type technology or other such known devices, each piece of equipment must have the ability to withstand a maximum fault current. If a well designed fault current limiter is available, such a requirement would not be necessary; and lower cost equipment can be used in the remainder of such a system.

Currently, there are two major varieties of known fault current limiters: (1) switched devices and (2) unswitched devices. Examples of the unswitched type include (a) saturable and tuned reactors whose impedance increases when current exceeds a specified threshold, (b) a superconducting device which changes to a normal resistance state when the current exceeds a prescribed limit and (c) in-line fuse devices which change phase and generate high arc voltages. All such unswitched devices have typically a very high cost and are expensive to maintain, as well as suffering from performance capability problems.

Most devices currently in use are switched devices wherein current is commuted from a low impedance main path to a higher impedance shunt path by various switching means. These switched devices must commute the current in a small time interval (typically less than half a period of a sixty Hertz cycle, i.e., less than about 8 milliseconds), and such requirements lead to complex equipment construction and the need to perform synchronized steps.

In another conventional device, a tuned circuit has no impedance in the normal state and is switched to a resistive and inductive impedance which can be made as large as necessary to accomplish the desired switching. The cost of such devices is about four dollars per kV ampere in 1980 dollars. The power losses are almost 0.1% which is excessive, and such devices also require capacitor volumes which occupy large spaces.

Other systems include series reactors which have the disadvantage of diverting power under normal system operation. This operating state reduces transient stability margins if installed in power stations with generating units. These systems also require substantial space, and the transient recovery voltages can exceed circuit breaker capacities.

Another conventional system includes high speed ground switches which have the disadvantage of occasionally causing more severe faults and causing longer fault durations.

Systems of prior art superconducting fault current limiters further include a superconducting solenoid in a bridge circuit of diodes or thyristors. During normal operation the full line current passes through the solenoid; and the current is passed in such a way that the solenoid sees only a DC current with a small ripple resulting in nearly zero impedance. When the current increases to the fault level, one pair of the diodes is reverse biased and no longer performs as a conductor. Therefore, the entire current must pass through the inductor, and a very high impedance is exhibited. The only losses are those of the AC current through the diodes which is about 0.07–0.14%.

Another variety of conventional fault current limiter uses a superconducting coil to DC bias an iron-core reactor. The device consists of two iron core reactors in series per phase, and these cores are linked by a common electromagnetically screened DC superconducting loop. Each reactor coil is wound on the center limb of a three-limbed core, and the line current passes through the reactor coils. The superconducting coil is linked only via transformer action. Under normal operation when rated MVA is passing through, the DC ampere turns are of such a value that both cores are saturated with the result that they offer the low saturated impedance of both coils in series. When a fault occurs, the cores desaturate alternatively during a cycle; and the impedance rises to a higher value, which is the saturated reactance of one coil added to the driving point impedance of the other due to transformer action with the DC screen, thereby limiting the current. In an experimental device of about 1.7 MVA, the normal-state losses were about 1.6 kW. In the normal state, the slight difference in the magnetic state of the two cores causes some distortion of the voltage across the device.

In another conventional unit a NbN, or other low temperature superconducting nonstrip, was used. When a fault is detected in such a device, the strip is made resistive by transition into the normal state. Most of the current is shunted into a parallel resistor, and then a breaker or switch opens in the superconductor circuit. The reduced current in the superconductor circuit enables a low-current switch to be used. Unfortunately, the length of NbN film needed for such a practical device is about 600 meters, which likely means it would be too expensive for commercial use. Also, hot spots can occur due to inhomogeneous switching and subsequent burnout.

It is therefore an object of the invention to provide an improved fault current limiter.

It is another object of the invention to provide a novel fault current limiter of a high temperature superconductor exhibiting a large thermal heat capacity.

It is a further object of the invention to provide an improved high temperature superconductor, fault current limiter operable in a fast switching, resistive mode.

It is an additional object of the invention to provide a novel high temperature superconductor, fault current limiter operable in phase with the system voltage.

It is yet another object of the invention to provide an improved high temperature superconductor, fault current limiter operable with substantially no inductance.

It is still a further object of the invention to provide a novel fault current limiter having a small coil shape of high temperature superconductor operable to provide a sharp resistance state transition.

It is another object of the invention to provide an improved high temperature superconductor, fault current limiter causing substantially no distortion in electrical transmission during normal operation.

Other advantages and methods of utilization will become apparent from the following description and drawings described hereinbelow with the numerals describing like features throughout the several drawings.

DETAILED DESCRIPTION OF PREFERRED EMBODIMENTS

Figure 1A:
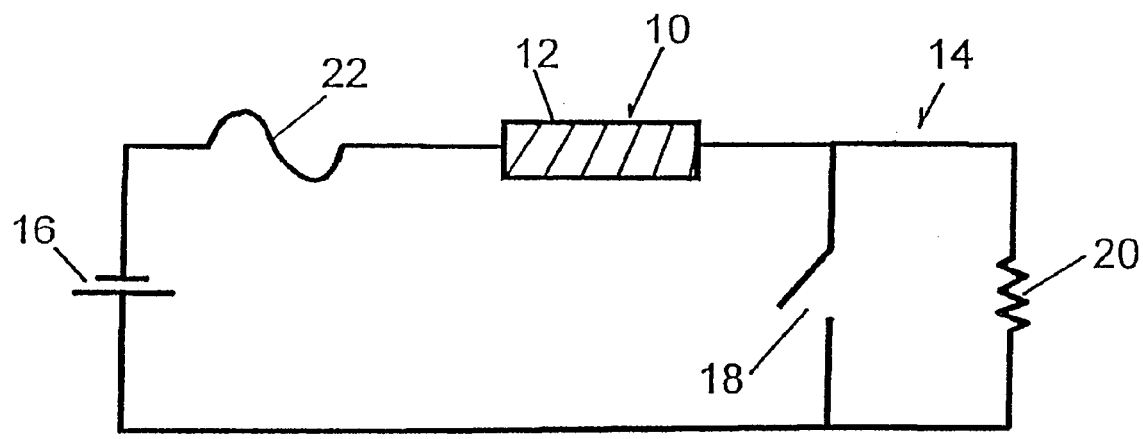
FIG. 1A illustrates schematically an example circuit employing a high temperature superconductor fault current limiter.
Figure 1B:
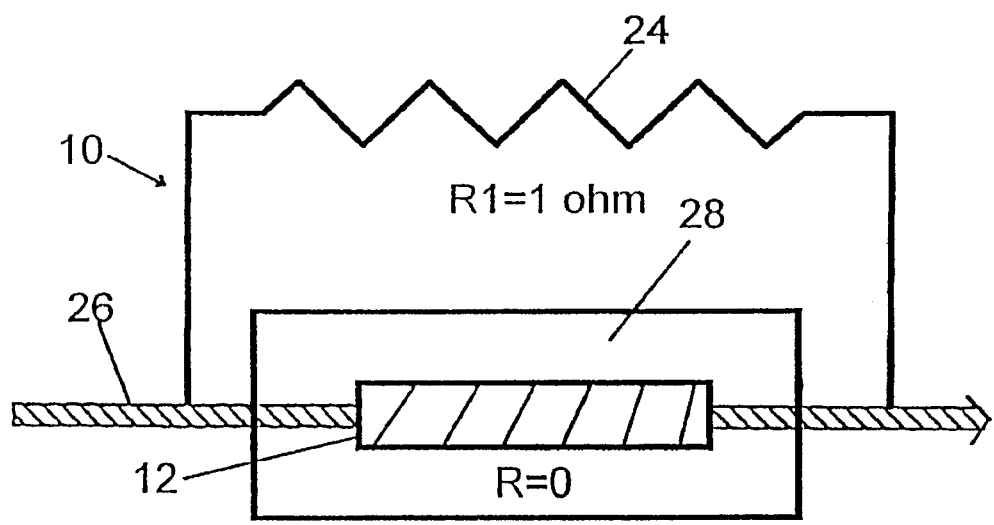
FIG. 1B shows another form of a circuit focusing on the fault limiter portion of the electrical system in FIG. 1A with 1B illustrating a no fault condition.
Figure 1C:
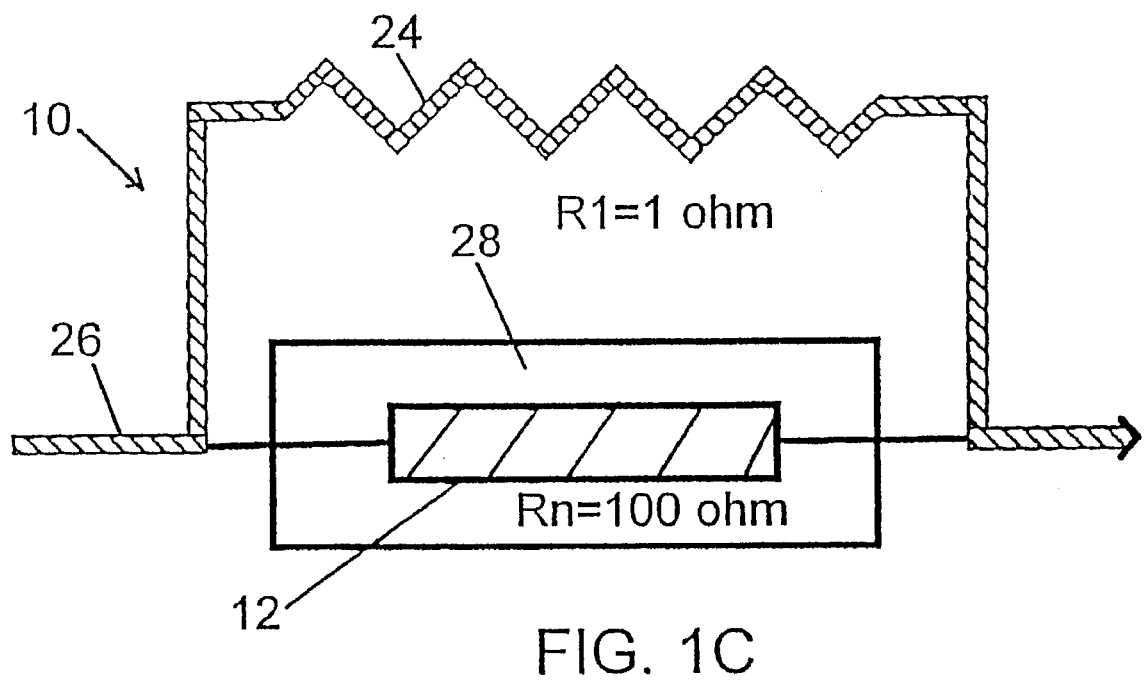
FIG. 1C illustrates a fault condition.
Figure 2A:
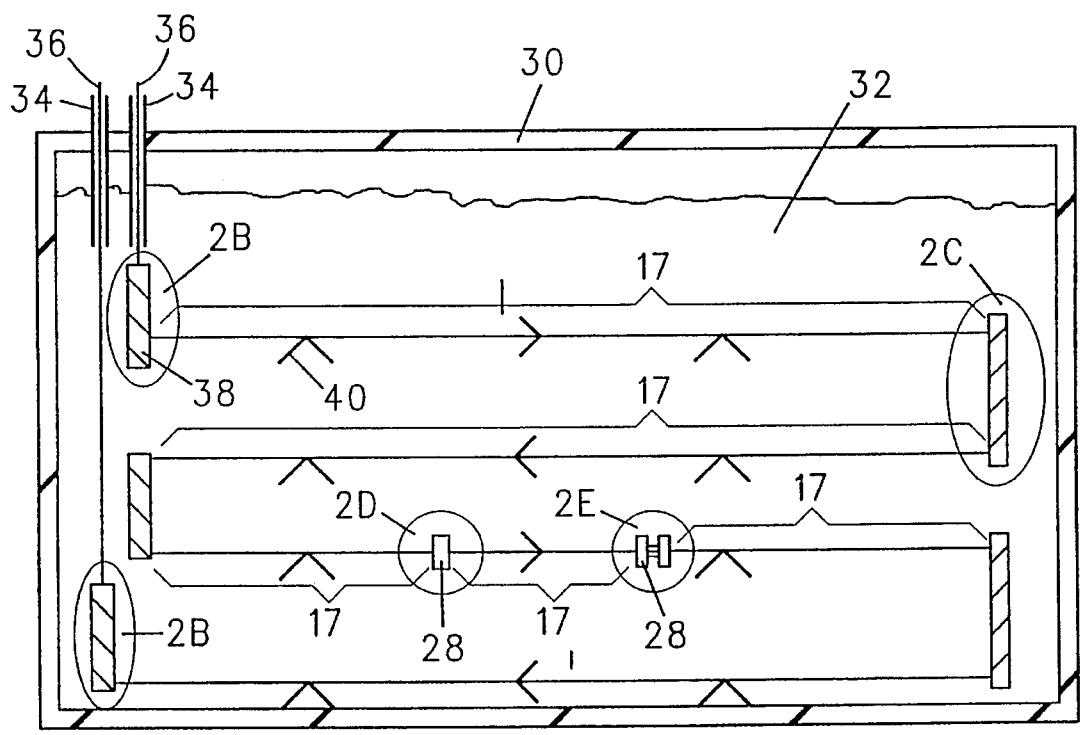
FIG. 2A illustrates a construction of a fault current limiter in accordance with the invention.
Figure 2B:
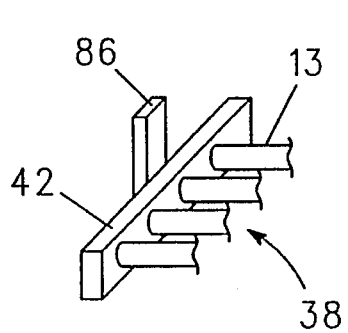
FIG. 2B shows an enlarged partial view of the region 2B indicated in FIG. 2A.
Figure 2C:
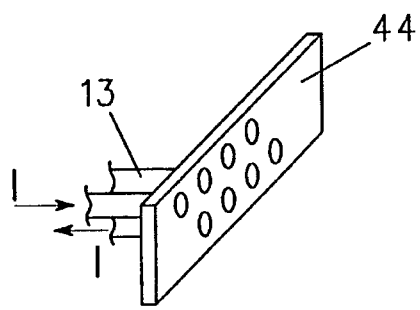
FIG. 2C shows an enlarged partial view of the region 2C indicated in FIG. 2A.
Figure 2D:
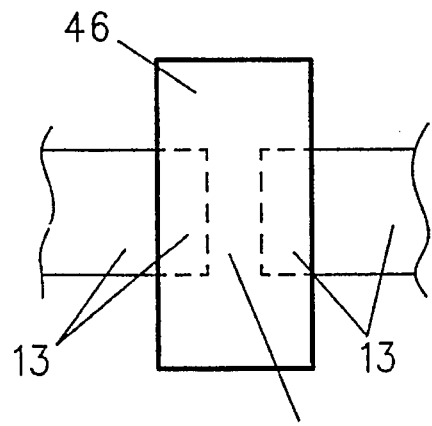
FIG. 2D shows an enlarged partial view of the region 2D indicated in FIG. 2A.
Figure 2E:
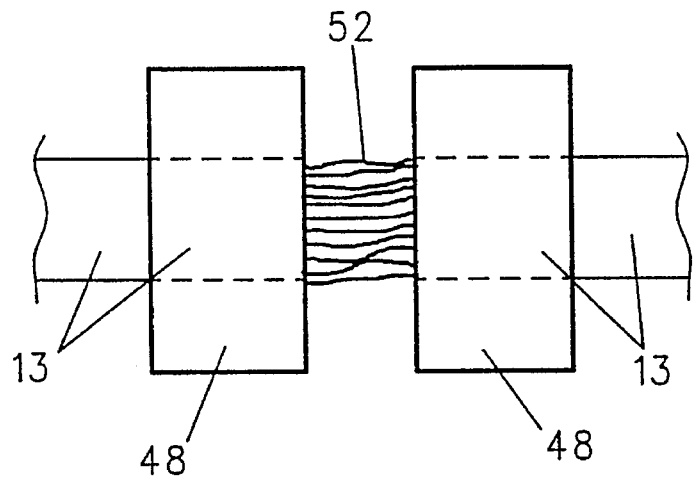
FIG. 2E shows an enlarged partial view of the region 2E indicated in FIG. 2A.

A fault current limiter ("FCL") 10 comprised of a high temperature superconductor ("HTSC") wire 12 is shown generally in FIG. 1A as part of a general power circuit 14 and also in FIGS. 1B and 1C showing fault and no fault operating conditions.

In FIG. 1A is shown a circuit diagram for the FCL 10. Power source 16 emits a constant voltage to the power circuit 14. When switch 18 is open, the power circuit 14 operates normally with light bulb 20 acting as the load. The power circuit 14 is designed so that the current drawn by the light bulb 20 or $i_{op}$, is below the critical current of the HTSC wire 12. When the switch 18 is closed, simulating a fault in the power circuit 14, the large current generated causes the HTSC wire 12 to become normal and provides resistance. This condition thus limits the current flow level and prevents fuse 22 from being blown as it would have been without the presence of the HTSC wire 12. If we now re-open the switch 18, the untainted fuse 22 allows current to flow; and the light bulb 20 is once again illuminated. The FCL 10 includes the HTSC wire 12, and a resistor 20 is connected electrically in parallel to the HTSC wire 12.

In another form of the invention shown in FIGS. 1B and 1C, the FCL 10 can include a superconducting part (the HTSC wire 12) and a resistor part 24 with resistance $R_1$ connected electrically in parallel. During normal operation, the superconducting part operates without electrical resistance, and all current flows through it. During a fault, the increase in current through the HTSC wire 12 causes it to change to the normal state. In the normal state, the resistance of the HTSC wire 12 is $R_n$, where $R_n \gg R_1$. Thus, most of the fault current will pass through the resistor part 24. The impedance of the FCL 10 is zero in the normal state and approximately $R_1$ in the fault state.

In the nonfault state, the losses in the FCL 10 include AC losses in the HTSC wire 12 and losses associated with thermal leakage from current leads 26 carrying the current from ambient temperature regions to the HTSC wire 12. Because the magnetic field associated with the HTSC wire 12 is small, the AC losses are small. The current lead losses are also small.

In general the HTSC wire 12 of the FCL 10 includes a length of HTSC in an insulated container 28 (a cryostat for example) of cryogenic refrigerant. The HTSC material can be, for example, Y—Ba—Cu—O, Bi—Sr—Ca—Cu—O, Ti—Ba—Ca—Cu—O, or any other such HTSC superconductor. Preferably, the critical temperature of the HTSC is above the boiling point of nitrogen; and the refrigerant is liquid nitrogen. The HTSC wire 12 also preferably has a critical current density versus magnetic field relationship, such that at the operating current, the current density falls quickly with increasing magnetic field. Most of the bulk HTSC made to date in long lengths exhibit this characteristic.

The cryostat 28 can be connected to a closed-cycle refrigerator to recondense the nitrogen that is boiled off. Alternatively, liquid nitrogen can be periodically replaced from a tank truck (not shown).

The size of the HTSC wire 12 can be determined by the following procedure. The external resistance $R_1$ is determined by the voltage and current of the line and the maximum expected fault current. The resistance $R_n$ is also determined by the maximum expected fault current. This resistance is also given by $$R_n = \rho L/A. \tag{1}$$

where $\rho$ is the resistivity of the HTSC wire 12 in its nonsuperconducting state, L is the length, and A is the cross sectional area. The value for A is determined by the current, I, to be carried in the superconducting state, and the critical current density j.

$$I = j A \tag{2}$$

For HTSC materials, the value for $\rho$ is typically of the order of 1 mΩ cm. Thus for a resistance of 1 Ω, L/A must be of the order of 1000 cm$^{-1}$. As an example, if j is 100 A/cm$^2$, then for I=1000 A, A=10 cm$^2$, and L=10 m. There is definitely an advantage in terms of reducing the volume of the HTSC 12 by operating at as high a j as possible. E.g., at j=1000 A/cm$^2$, for I=1000 A, A=1 cm$^2$, and L=1 m, results in a reduction in the HTSC volume by a factor of 100. The volume of the HTSC wire 12 scales directly as $R_n$, inversely as $\rho$, and as the inverse square of j. Note that the requirement for high $\rho$ recommends against the use of Ag in the HTSC wire 12 for strengthening purposes. Table 1 provides example values for different parameters of j and $R_n$.

Table 1. Size of the FCL 10 as a function of critical current density j and required fault resistance $R_n$ for I=1000 A, and p=1000 μΩcm.

TABLE 1

Size of the FCL 10 as a function of critical current density j and required fault resistance $R_n$ for I = 1000 A, and p = 1000 μΩcm.

| $R_n(\Omega)$ | j (A/cm²) | A (cm²) | L(m) | Mass (kg) |
|---|---|---|---|---|
| 1 | 100 | 10 | 100 | 600 |
| 1 | 1000 | 1 | 10 | 6 |
| 1 | 10,000 | 0.1 | 1.0 | 0.06 |
| 1 | 100,000 | 0.01 | 0.1 | 0.0006 |
| 10 | 100 | 10 | 1,000 | 6000 |
| 10 | 1000 | 1 | 100 | 60 |
| 10 | 10,000 | 0.1 | 10 | 0.6 |
| 10 | 100,000 | 0.01 | 1.0 | 0.006 |
| 100 | 100 | 10 | 10,000 | 60,000 |
| 100 | 1000 | 1 | 1000 | 600 |
| 100 | 10,000 | 0.1 | 100 | 6 |
| 100 | 100,000 | 0.01 | 10 | 0.06 |
| 1000 | 100 | 10 | 100,000 | 600,000 |
| 1000 | 1000 | 1 | 10,000 | 6000 |
| 1000 | 10,000 | 0.1 | 1000 | 60 |
| 1000 | 100,000 | 0.01 | 100 | 0.6 |

From Table 1, it seems clear that large $R_n$ and low j will result m devices that can be too expensive. For more modest values, e.g., $R_n=10\Omega$ and j=1000 A/cm², a 60 kg quantity of HTSC is needed. Assuming a total (includes cryostat, refrigerant, lead-in connectors, etc.) manufacturing cost of $1000/kg, the cost of the FCL 10 would be $60,000/150,000 kVA or about $0.40/kVA, which is about a factor of ten less than the 1980 state of the art.

It is desirable to keep the magnetic field around the conductors of the FCL 10 as low as possible in order to increase j. Therefore, one would preferably fabricate the FCL in a manner shown in FIG. 2. The FCL 10 includes an insulated container 30, filled with liquid nitrogen 32. The filling device and leads to the refrigerator are not shown. The container 30 is perforated by tubes 34, which allow the current leads 36 to pass into the container 30. At terminal 38 the current transfers to the HTSC wire 12. In the embodiment of FIG. 2, the HTSC wire 12 also comprises one or more strands 13 (see FIGS. 2B–2E) of material with rectangular, oval, tubular, or other such convenient geometry. The cross sectional dimension may be in the range of several microns to several cm. The length may be several cm to several meters. The superconducting path can be constructed to follow a serpentine path, or other pattern, to accomodate the spatial dimensions of the container 30 and/or minimize the amount of material used. The superconductor assembly and connectors are mechanically supported within the container 30 by electrical insulators 40.

At the terminal 38 the strands 13 are inserted into holes in copper plate 42 and electrically connected, e,g., by solder, to the plate 42. The current lead 36 is also soldered to the plate 42.

At connector 44 the current reverses direction with conductors that pass current in opposite directions in close proximity to each other. At each turning point, the connector 44 can join one or more pairs of the strands 13. As can be seen by reference to FIGS. 2A, 2B and 2C, HTSC segments 17 can include multiple parallel conducting paths (such as the strands 13 in FIGS. 2B and 2C).

Additional connectors 46 and 48, for example, can be used as needed for increased reliability and accommodation of thermal contraction. The connector 46 joins two sets of the strands 13 of the HTSC. The strands 13 are soldered into holes in the connector 46, with perhaps a gap 50 between the ends of a pair of the strands 13. This arrangement facilitates the use of shorter lengths of individual ones of the strands 13. Further, if one conducting element (one of the strands 13) breaks in a given segment 17, the copper plates 42 supporting the assembly can help distribute the current uniformly again in another of the strands 13 in the segment. At the connector 48, each of the strands 13 is soldered into the copper plates 48. A pair of the plates 48 are joined by a braided copper conductor 52 that is flexible and will accommodate thermal expansion and contraction, relieving strain on the strands 13.

In the example shown in FIG. 2, the self magnetic field of each of the strands 13 is partially offset by the opposing magnetic field of its nearest neighbors. This allows a larger j, since each of the strands 13 sees a small magnetic field. In addition, the FCL inductance is lower, which makes current switching faster to the resistor 24 during a fault condition.

Figure 3:
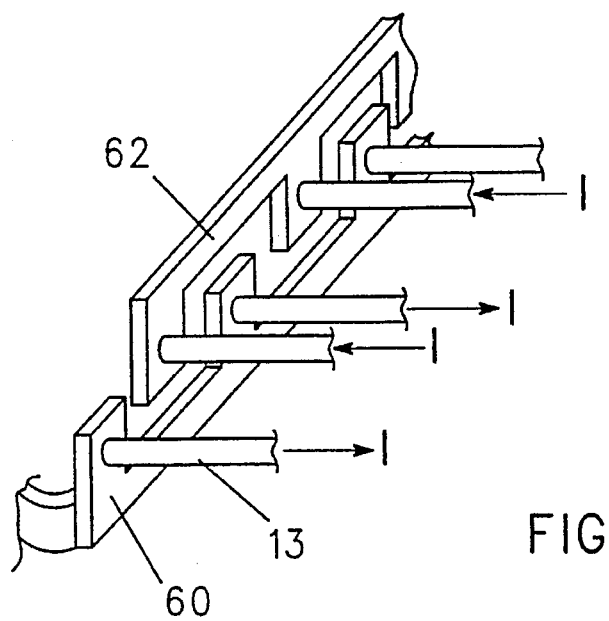
FIG. 3 illustrates a construction of fault current limiter for minimizing magnetic field.

Another example geometry for minimizing magnetic field near the strands 13 is shown in FIG. 3. In this case the connectors 60 and 62 allow adjacent ones of the strands 13 on the same horizontal level to carry current in opposite directions. The strands 13 of the superconductor also need not run predominantly horizontal, but could nm vertically.

The current leads 36 are cooled by the nitrogen gas that evaporates as heat is conducted by the leads into the liquid nitrogen. Approximately 0.036 W of heat per lead pair per ampere of current pass into the liquid nitrogen. Each watt of heat will require approximately 10 watts of refrigeration electricity. Thus, the current leads 36 will require 0.26 W of parasitic loss per amp of current. If the voltage is 10 kV, this amounts to a 0.0036% loss.

The magnetic field for each of the strands 13 is expected to be small and less than $H_{c1}$. The losses are then determined by the surface area of the strands 13.

Type-II superconductors transporting AC current are subject to hysteretic loss, due to irreversible magnetization during a cycle. For power frequencies (<20 kHz), this loss is independent of frequency, f. The power loss per unit area Q for a slab of such superconductor is $$Q=KSH_o^3/J, \qquad (3)$$

where $H_o$ is the maximum magnetic field at the surface of the superconductor, J is the critical current density, and K is a constant that depends on geometry. If the superconductor is a slab, then $$K=2\mu_o/3, \qquad (4)$$

where $\mu_o=4\pi\times10^{-7}$ N/A² is the magnetic permeability of free space. At any given temperature T, J decreases with increasing $H_o$.

We assume J=1000 A/cm² and $H_o$=100 G=0.01 T. Then at f=60 Hz, Q=5×10⁻¹⁸ W/m². Even if the surface area were as high as 100 m² per ampere of current, the AC losses would be negligible.

In order to ensure rapid recovery after a fault condition has passed, it is desirable that while in the fault state, the heat dissipation in each of the strands 13 be no larger than that which can be passed to the liquid nitrogen coolant. The heat transfer via pool boiling in liquid nitrogen is limited to about 10 W/cm² of wetted perimeter area. If we assume that each conductor has a square cross section, i.e., one cm on a side, and carries 10,000 A (j=10⁴ A/cm²), then each one cm long piece of superconductor has four cm² of surface area and will internally create 10 W of Joule heat. This is well within the capability of the pool boiling process.

Figure 4A:
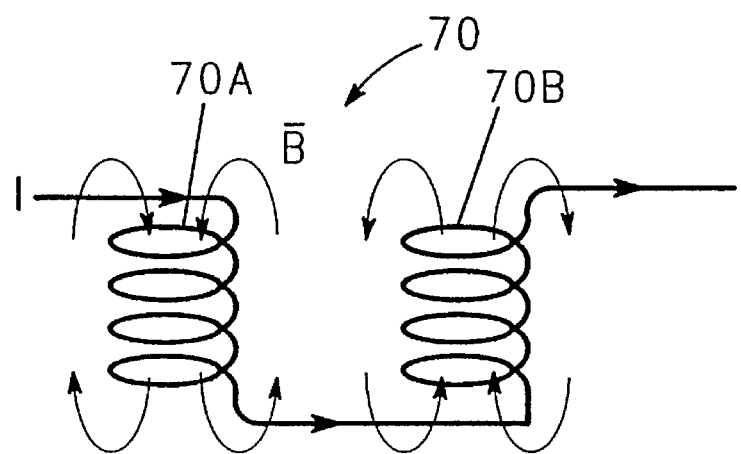
FIG. 4A illustrates one example of a coil pair geometry for a FCL and FIG. 4B is another form of coil pair having balanced transition currents in each coil.
Figure 4B:
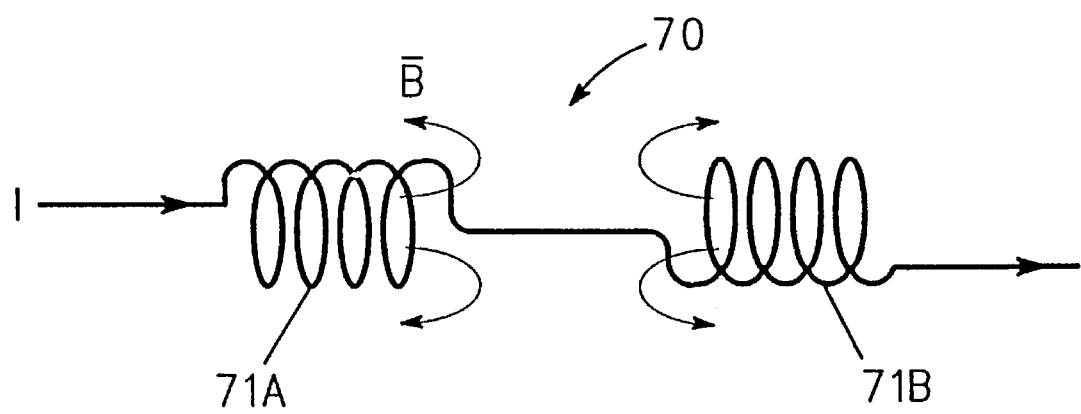

In another form of the invention the HTSC wire 12 is in the form of a pair of coils 70A and 70B (see FIG. 4). FIG. 4B shows another arrangement of the coils 71A and 71B having a common longitudinal axis. In a coil geometry for the HTSC wire 12 the result is a sharper transition to the resistive state than for a straight wire. The length of each coil pair (70 or 71) can be adjusted before forming the FCL 10 so that the transition current is about the same for each of the coils 70A and 70B or 71A and 71B. The coils 70 or 71 can be arranged in pairs, with the magnetic field direction of each of the coils 70A and 70B (or 71A and 71B) of the pair in opposition. To a first approximation the magnetic fields of the coil pair 70 or 71 cancel so that the magnetic fields from adjacent coils do not significantly affect the performance of any given coil. Also, the external magnetic field from a large number of coil pairs can be very low. Each of the coils 70A and 70B (or 71A and 71B) introduces a small amount of inductance to the circuit of the FCL 10, but preferably have only a few turns in each pair of coils 70A and 70B (or 71A and 71B), they are primarily resistive in behavior. Individual coils can however have, for example, from 5 to as many as 1000 turns, be 1–10 cm in diameter and produce fields of 10–1000 Gauss.

Three different examples of superconducting wires for use in the fault current limiter are as follows: A $Y_{123}$ coil with no silver in it, a series of straight $Y_{123}$ wires with 15% silver by weight, and a series of straight $Y_{123}$ wires with no silver. The HTSC wire 12 can be alloyed with silver to provide certain additional advantages. All of the wires can be sintered with silver contacts baked on to minimize contact resistance.

Some of the characteristics, advantages and disadvantages, of each of the above example HTSC wires 12 are as follows:

1. $Y_{123}$ coil, no silver

Characteristics:

2.1 m long, 0.8 mm diameter, $J_c$=85 A/cm$^2$, $R_n$=70 Ohms

Figure 5A:
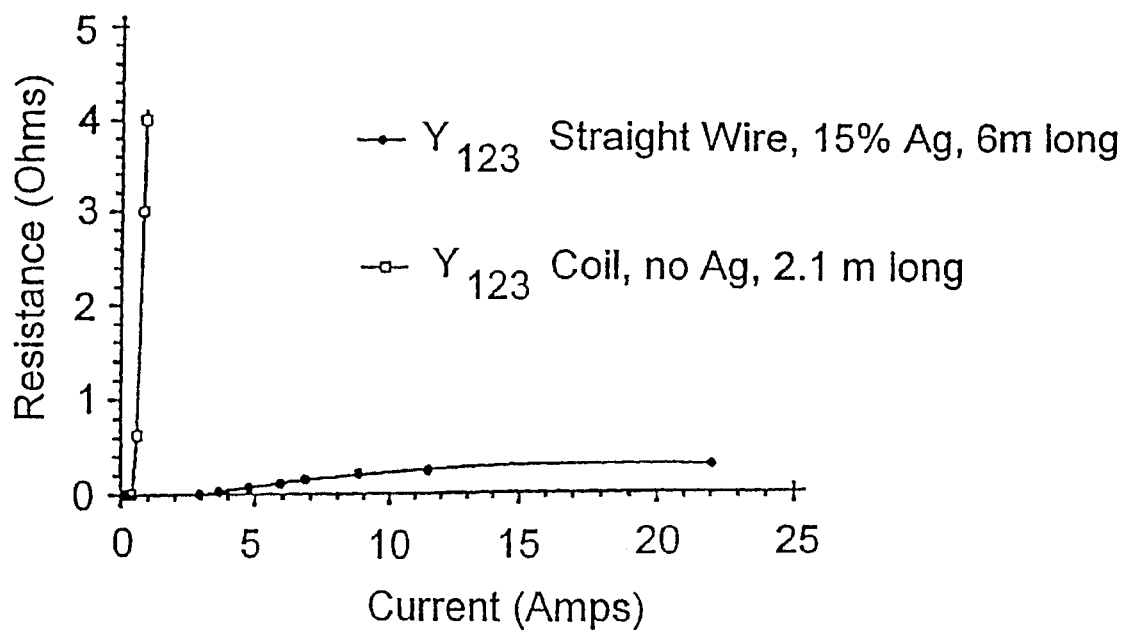
FIG. 5A illustrates resistance-current response curves for straight wire and coil fault current limiters.

Advantages:

a. As can be seen in FIG. 5A, the coil 70 gives high resistances at low current values, which gives the FCL 10 a low current limit when a fault condition occurs.

b. Design parameters for the coil 70 are:

1. Switch Open

V$_{constant}$=6 Volts

R$_{light}$=60 Ohms (GE 6 V bulb)

R$_{sup}$=0 Ohms i$_{op}$=0.1 Amps

2. Switch Closed

V$_{constant}$=6 Volts

R$_{sup}$=4.3 Ohms i$_{limit}$=1.4 Amps 3.1.5 Amp fuse used

Disadvantage:

a. The absence of silver, and thinness of the coil pair 70, makes it somewhat fragile. It should be noted, however, that the coil pair 70 has shown good durability in not breaking in any experiments performed.

2. $Y_{123}$ straight wires, with 15% silver by weight

Characteristics:

33 wires, each 18 cm long, 0.9 mm diameter, $J_c$=440 A/cm$^2$, $R_n$=0.27 Ohms

These wires can be placed in series, creating a single wire that is 6.0 m long with $R_n$=9.0 Ohms Advantages:

a. The presence of silver makes thin wires more durable.

Disadvantages:

a. Although the silver makes the superconductor stronger, its low resistivity makes the wire less resistive. As shown in FIG. 5A, this wire has both a slow and low resistance response to applied current compared to the coil pair 70, and at 77° K. the resistance saturates at about 0.33 Ohms.

b. Because of this resistance response, the FCL 10 constructed using this wire requires a lower voltage while producing a higher limiting current. The design specifications for a circuit are:

1. Switch Open:

V$_{constant}$=2 Volts

R$_{light}$=8 Ohms (GE 2 V bulb)

R$_{sup}$=0 Ohms i$_{op}$=0.25 Amps

2. Switch Closed:

V$_{constant}$=2 Volts

R$_{sup}$=0.25 Ohms i$_{limit}$=8 Amps 3.9 Amp fuse needed $Y_{123}$ straight wires, no silver Advantages:

Wires of this type would combine the desirable features of the above two HTSCs: the absence of silver would give them a strong resistance response to applied current.

Disadvantages:

As with the coil pair 70, these wires would be more fragile than those made with silver in them. There are ways to minimize the disadvantage, however, the most obvious two being:

1. Shorten the wires to 10 cm long. Although this would require that more wires be made for a given length of the HTSC wire 12, the shorter wires would be less susceptible to being broken.

2. Increase the diameter of the wire to between 1 and 1.5 mm. This would lessen the resistance response by a factor of 2 to 4, respectively, from that of the coil while increasing the durability of the wire considerably. This would probably be a desirable tradeoff, because the resistance response would still be much greater than that of the silver-filled wire while the HTSC wire 12 would be more capable of absorbing various stresses and strains.

One analysis includes silver in the composition of the HTSC wire 12 for strengthening purposes. This silver can comprise between 5 to 15% of the total sample weight, and a comparable percentage of the total volume. In addition to increasing the strength, however, the presence of silver also decreases the resistivity of the HTSC wire 12 because silver itself has a much lower room temperature resistivity (1.6× 10$^{-6}$ Ohm·cm) than the $Y_{123}$ composition (~8×10$^{-3}$ Ohm·cm). Therefore, the normal resistance of a silver-filled sample is given by the general equation:

R=(p)(L)/A where P=normal resistivity of sample

L=length and

A=cross sectional area

Figure 5B:
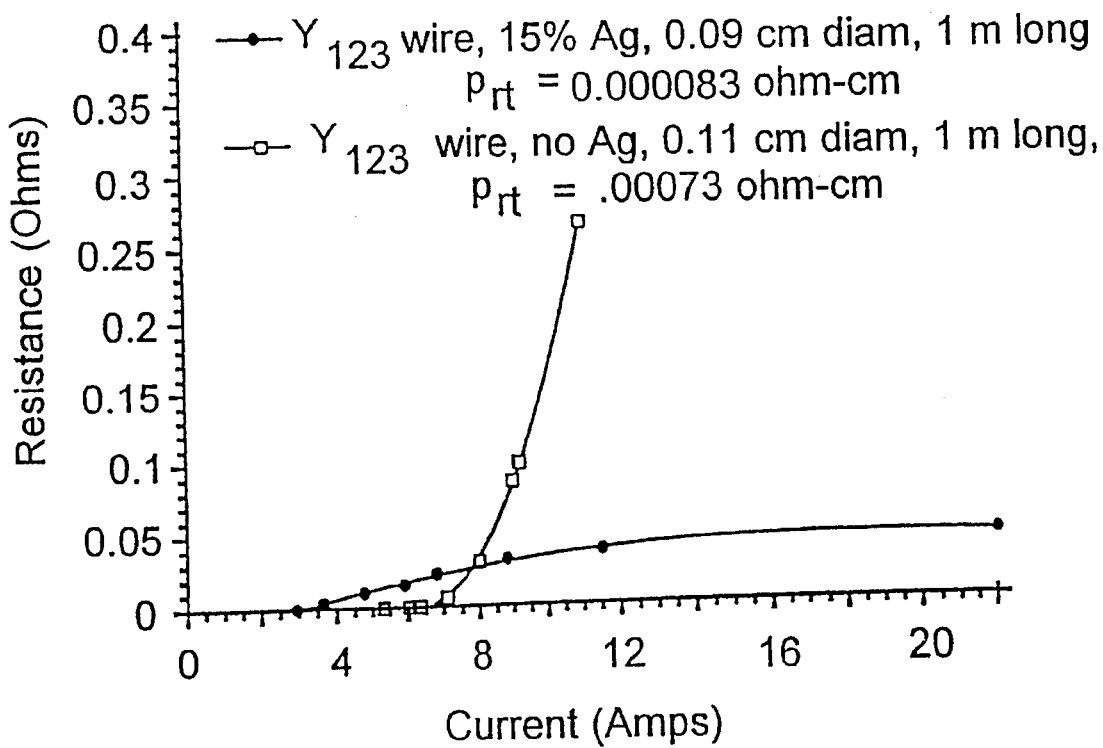
FIG. 5B shows resistance-current response curves for HTSC wires with and without silver added.

This resistance is substantially less than that of a superconducting sample without silver of the same dimensions. The superconductor's maximum normal state resistance is ($R_{77° K.}$=$R_n$/3) and with added silver this typically leads to a weaker resistance response to applied current. FIG. 5B illustrates this effect by comparing two sample wires of similar size and shape but with different levels of silver, and it can be seen that the silver-filled sample's resistance has reached its maximum value at 0.05 Ohms while the silver-free sample's resistance continues to rise as current is applied to it.

Choosing between thick and thin wires involves a tradeoff between a durable sample capable of handling large currents, which characterizes thicker wires, and a higher normal state resistance, which is characteristic of thinner wires (see the above equation). Because of the low currents passed through this particular device, however, the choice was narrowed to one between sample robustness and resistance. A sample thickness was chosen which would make it strong enough to endure various thermal and mechanical stresses and strains, while remaining thin enough to give a high normal state resistance. In large scale operations, where operating currents are substantially higher, thicker wires would probably be better suited for use.

For a given thickness and length of the HTSC wire 12, a coil shaped superconductor will yield a stronger resistance response to applied current than a straight wire. The reason for this is given pictorially in FIG. 5C and will be described hereinbelow.

Superconductivity can be destroyed in a sample in three ways: subjecting it to a current above its critical current $I_c$, to a magnetic field greater than its critical field $H_c$, or by allowing it to reach a temperature higher than its critical temperature $T_c$. The sample in the FCL 10 is kept at liquid nitrogen temperature (77° K., which is below $T_c$ of ~90° K.), which is below the transition temperature from the superconductive to the normal state. This transition preferably must be accomplished as quickly as possible if the FCL 10 is to have maximum efficiency, and is solely a function of applied magnetic field and current.

Figure 5C:
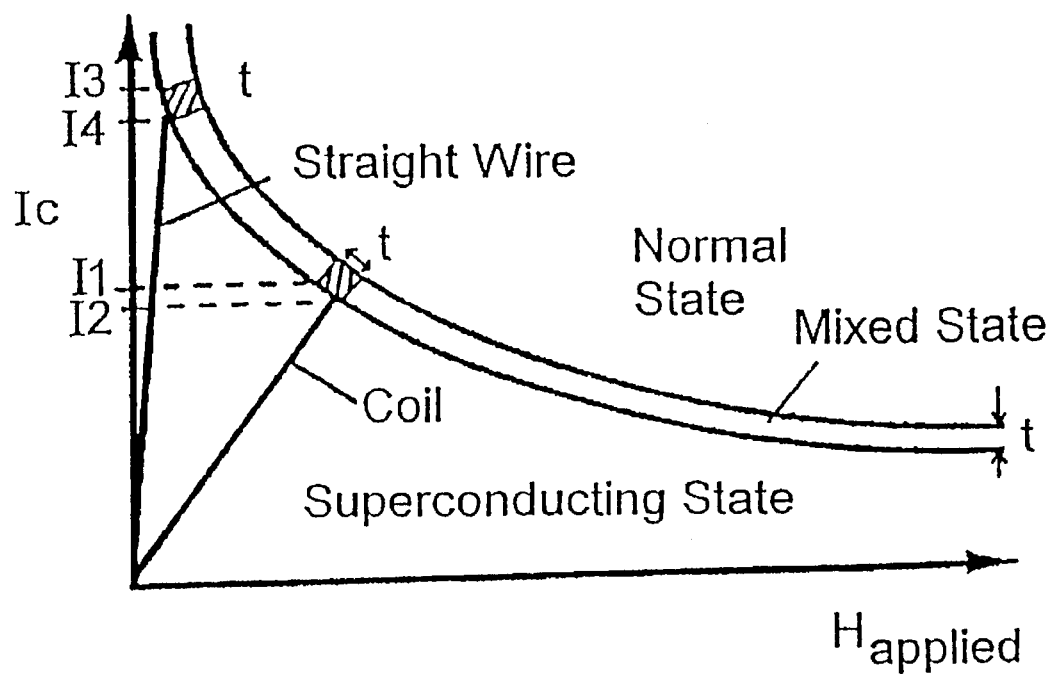
FIG. 5C illustrates the relationship of critical current to magnetic field for two superconductors of different geometry (wire and coil)

FIG. 5C details the relationship between the critical current and applied field for the HTSC wire 12. Above the curve which the two variables form, the HTSC wire 12 is in the normal state, while at lower currents and fields the HTSC wire 12 is superconductive. Because the wire or coil is not homogeneous along its length, there exists a mixed state in between these regimes described in FIG. 5C. Consequently, part of the HTSC wire 12 is superconducting and part of it is normal. This mixed state referred to should not be confused with the mixed state that is intrinsic to Type II superconductors which allows magnetic flux to penetrate parts of the superconductor. Rather, what is meant here is that if small pieces were cut at different pans of the wire or coil, each piece would have a slightly different $I_c$.

The magnetic field which is applied to the HTSC wire 12 can arise in two ways: from an externally applied field and/or from a self-induced field formed by the passage of current through the HTSC wire 12. Since no external field is applied during operation, the only fields to be considered are those produced by the currents through each of the HTSC wires 12. These fields differ substantially in both magnitude and uniformity depending on the geometry of the HTSC wire 12, and those produced by the current in both a straight wire and coil are superimposed on the curve of FIG. 5C.

The reason for the difference in slopes between the two geometries can be seen by examining each case individually. For a straight wire, the current induces circulating magnetic fields inside the superconductor whose form, derived from Ampere's Law, is:

$$H_{in}(r)=(I \cdot r)/(2 \cdot \pi \cdot R^2)\theta, \quad (2)$$

where
I=current
r=radial distance from center
R=radius of wire

The field inside therefore rises linearly with r, and reaches a maximum at the surface of the HTSC wire 12. For the coil pair 70, on the other hand, the field at a point inside the sample is a superposition of the fields formed by its neighboring loops of current and the self-field from the current in the wire itself. Using the Biot-Savart Law along with Ampere's Law, the total field inside the wire is given approximately as:

$$H_{in}(r)=(I \cdot r)/(2 \cdot \pi \cdot R^2)\theta+(0.7 \cdot N \cdot I)/s \, Z$$

where
N=number of coil turns
s=radius of each coil
Z—runs along the coil's axial direction The first term in this equation is the contribution from the self-field while the second is that from the neighboring fields. Here the dependence on r is similar to that of the straight HTSC wire 12, although the interaction of the fields yields some added minor terms (not listed here for simplicity but known in the art) which make the field inside more uniform than that of the wire.

If one now replaces terms in Equation 3, the dimensions of the actual coil 70 used in the FCL (given in FIG. 5B) and compares the field to that obtained by Eq.2 for a wire of the same thickness, it is found that:

H(coil)=I(5θ+13Z) Oersteds so H(coil) is about 15·I
Oersteds, while H(wire)=5·I Oersteds Thus the slopes of the two differ by a factor of three, which leads to the differing curves of FIG. 5C.

Figure 5D:
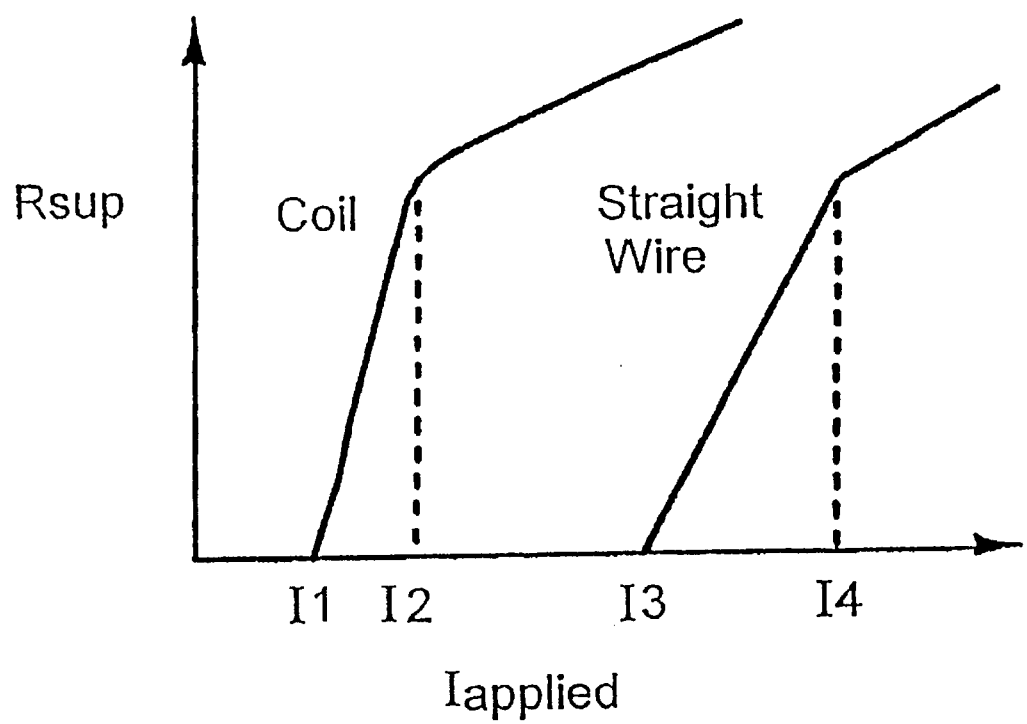
FIG. 5D shows the relationship for these two geometries for applied field and resistance response, and FIG. 5E compares resistance response of a coil and straight wire of similar dimensions.
Figure 5E:
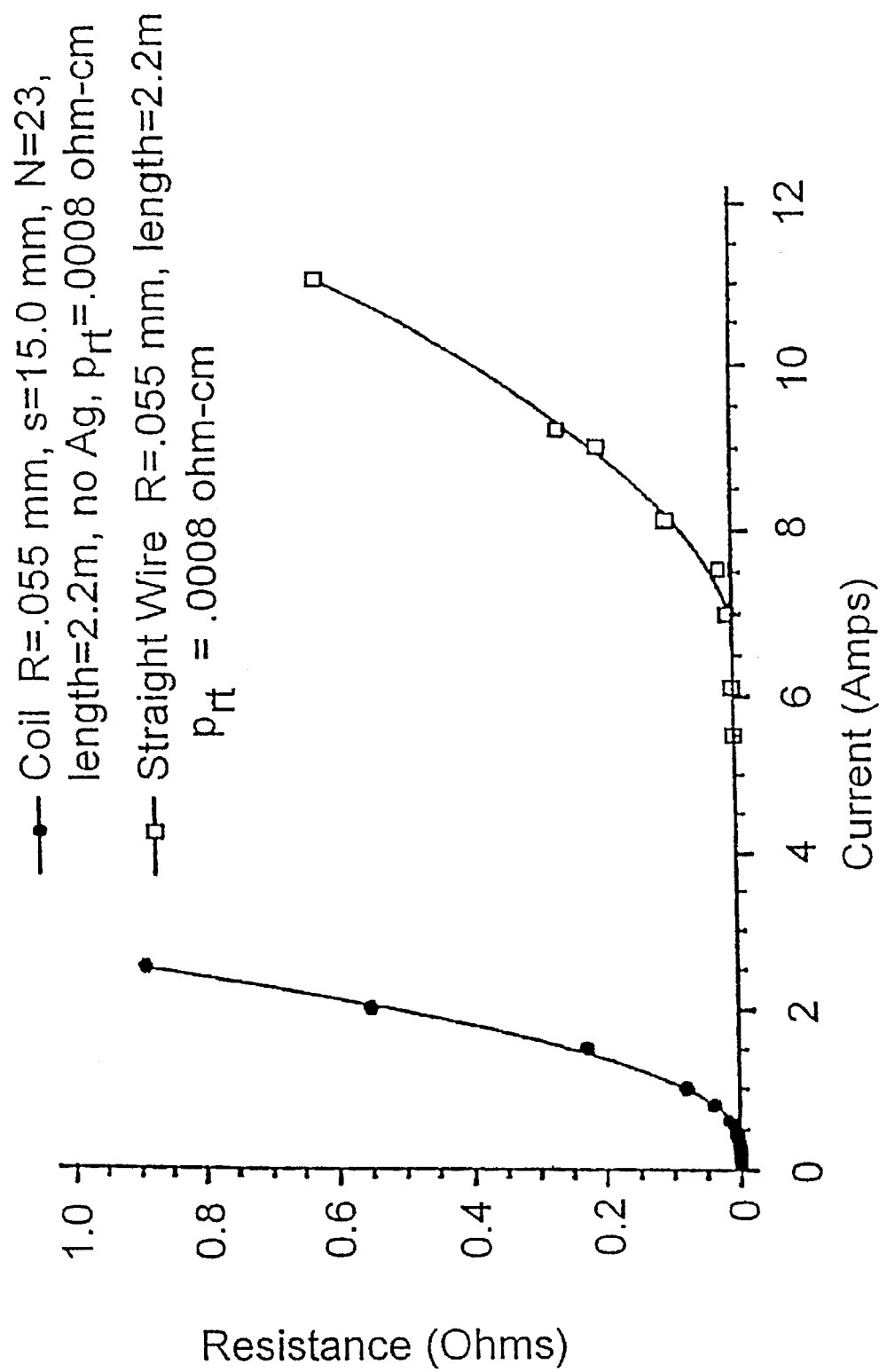

Because of this difference in slopes, the coil 70 and straight HTSC wire 12 intersect the transition curve at different points. Namely, the straight HTSC wire 12 meets the curve when it is more 'vertical' than it is in the coil's case. This means that, for a given transition from the superconductive to the normal state over a mixed-state area $t^2$, the change in current $\Delta I$ will be greater for a wire than a coil. This leads to the coil's stronger resistance response (FIG. 5D) which has been borne out experimentally (FIG. 5E).

HTSC FCL's have the advantage that at liquid nitrogen temperatures, the heat capacity of materials is about 1000 times greater than at liquid helium temperatures. Thus, the high $T_c$ superconductors are much less likely to quench due to random thermal disturbances. If they quench for nonthermal reasons (e.g., during a fault current—see discussion below), the temperature rise will be much smaller during the quench than for low $T_c$ systems. Thus, when the disturbance is over, the relatively small temperature change in the HTSC wire 12 will result in essentially an immediate return to the superconducting state. In addition, the latent heat of evaporation of nitrogen is several orders of magnitude larger than that of helium, and operation in the normal state will result in a relatively small increase in the evaporation of the nitrogen. Compared to a low $T_c$ FCL, a quench of a high $T_c$ FCL will not seriously perturb the operation of the system. Recovery will be rapid, and the system integrity will be robust.

The quenching of a superconducting magnet is very different from the quenching of a resistive FCL. Before discussing this in detail, it should be noted there are different ways to cause a quench. Superconductivity exists within a region bounded by a surface relating temperature, magnetic field, and current density. If any of these parameters becomes too high, superconductivity is lost; and the system then develops a resistance.

An important advantage of a resistive FCL (such as an HTSC FCL) compared to a magnet or to an inductive FCL is that there is almost no inductance for the HTSC wire 12. There is very little energy stored in magnetic fields, and the current can be extracted immediately if necessary. Further, the quench mechanism of which we take advantage in the FCL 10 herein is the excursion in current density and magnetic field, not temperature. With this type of excursion, the entire length of the HTSC wire 12 in the FCL 10 makes the transition to the resistive state almost immediately, so there will be no hot-spots to worry about. Also, as previously discussed, the much higher thermal capacity available by working at LN temperatures, greatly reduces the probability of a random thermal quench.

The high $T_c$ FCL 10 will have as a design parameter the current density of the HTSC wire 12, and generally speaking, the higher the current density available in the HTSC wire 12, the more compact the FCL 10 can be made. In addition, with present day materials the fall-off of current density with applied field is relatively rapid, so that the current density versus magnetic field characteristics are ideal for FCL application, even though they may be a curse in other applications. Low $T_c$ materials do not exhibit such a rapid fall off. Of equal importance, by operating at relatively low current densities, it is possible to cryogenically stabilize the FCL conductor so that even for very long term operation in the normal state it will not burn up. Because of the cost and high boiloff rate for liquid helium, this would not be practical in a low $T_c$ resistive limiter.

While preferred embodiments and nonlimiting examples have been described, the scope of the invention is defined in terms of the claims and their equivalents.

What is claimed is:

1. A fault current limiter for a circuit having an electrical current carrying path, comprising:

a high temperature superconductor disposed in said current carrying path, said superconductor cooled below its critical temperature to maintain the superconducting electrical properties during operation as said fault current limiter;

said superconductor comprising a plurality of segments, at least one of said segments consisting of multiple parallel conducting path elements having open space between each of said elements in the at least one segment and said superconductor segments being unsupported along most of each of the segments, thereby allowing unobstructed access for a coolant along most of said segment; and said segments being supported at the ends of each of said segments by means for supporting which comprises metallic conductive means for conducting the electrical current through an unbroken one of said parallel conducting path elements in said segments in the event one of said parallel conducting path elements within one of said segments breaks.

2. The fault current limiter as defined in claim 1 further including a resistor disposed in parallel with said superconductor in said current carrying path.

3. The fault current limiter as defined in claim 1 wherein said high temperature superconductor is alloyed with a noble metal.

4. The fault current limiter as defined in claim 3 wherein said noble metal comprises silver.

5. The fault current limiter as defined in claim 4 wherein the silver has a content in the range of about 5% to 20% by weight.

6. The fault current limiter as defined in claim 1 wherein at least one of said parallel conducting path elements comprises a plurality of coils, and at least two of said coils in said parallel conducting path element have different longitudinal axes providing enhanced fault current switching speed due to a sharp transition to a resistive state.

7. The fault current limiter as defined in claim 1 wherein said high temperature superconductor comprises means for exhibiting substantially resistive behavior upon loss of the superconductive state.

8. The fault current limiter as defined in claim 1 wherein said superconductor is operable in phase with an alternating current voltage of said current carrying path.

9. The fault current limiter as defined in claim 1 wherein each of the segments are further connected to another adjacent segment electrically in series and each said segment is joined to the adjacent segment by a flexible normal metal conductor to accommodate thermal expansion.

10. The fault current limiter as defined in claim 1 wherein each of said multiple parallel conducting path elements comprise a plurality of coils having different longitudinal axes.

11. The fault current limiter as defined in claim 10 wherein said plurality of coils comprises two adjacent coils disposed in series in said circuit to provide a transition current of approximately the same amount in each of said coils.

12. The fault current limiter as defined in claim 10 wherein a plurality of said adjacent coils are connected by a flexible normal metal conductor.

13. The fault current limiter as defined in claim 10 wherein each of said coils comprises about 5–1000 turns with about 10–100 Gauss magnetic field.

14. A fault current limiter for a circuit having an electrical current carrying path, comprising a plurality of high temperature superconductor segments wherein each of said segments have multiple parallel conducting path elements of high temperature superconductors and having open space between each of said elements and said segments being unsupported across their working length, thereby allowing unobstructed access for a coolant along said segments; and said segments having supports at the ends of said working length, with said conducting elements of each of said segments ending in said supports and said supports comprising a metallic conductive means for conducting the electrical current through an unbroken one of said multiple parallel conducting path elements of each of said segments in the event one of said parallel conducting paths of each of said segments breaks, said segments being cooled below their critical temperature to maintain superconducting electrical properties of said high temperature superconductors during operation as said fault current limiter.

15. The fault current limiter as defined in claim 14 further including a resistor element disposed in parallel with said superconductors in said fault current limiter.

16. The fault current limiter as defined in claim 14 wherein said segments include for said path elements a coil pair.

17. The fault current limiter as defined in claim 16 wherein the magnetic fields of each coil of said coil pair have opposing polarity.

18. The fault current limiter as defined in claim 14 wherein said superconductors have a high heat capacity for avoiding loss of superconductivity from thermal fluctuations from ambient thermal sources.

19. The fault current limiter as defined in claim 14 wherein said segments comprise substantially a resistive electrical component.

20. The fault current limiter as defined in claim 14 wherein said superconductors are alloyed with silver for controlling resistance/current switching behavior.

21. The fault current limiter as defined in claim 14 wherein said silver has a content less than 20% by weight.

* * * * *